US010096276B2

(12) United States Patent
Wen

(10) Patent No.: US 10,096,276 B2
(45) Date of Patent: Oct. 9, 2018

(54) METHOD FOR DRIVING AMOLED

(71) Applicant: SHENZHEN CHINA STAR OPTOELECTRONICS TECHNOLOGY CO., LTD., Shenzhen, Guangdong (CN)

(72) Inventor: Yichien Wen, Shenzhen (CN)

(73) Assignee: SHENZHEN CHINA STAR OPTOELECTRONICS TECHNOLOGY CO., LTD, Guangming New District Shenzhen, Guangdong (CN)

( * ) Notice: Subject to any disclaimer, the term of this patent is extended or adjusted under 35 U.S.C. 154(b) by 384 days.

(21) Appl. No.: 14/960,199

(22) PCT Filed: Oct. 27, 2015

(86) PCT No.: PCT/CN2015/092937
§ 371 (c)(1),
(2) Date: Dec. 4, 2015

(87) PCT Pub. No.: WO2017/063228
PCT Pub. Date: Apr. 20, 2017

(65) Prior Publication Data

US 2018/0122287 A1 May 3, 2018

(30) Foreign Application Priority Data

Oct. 15, 2015 (CN) .......................... 2015 1 0666037

(51) Int. Cl.
*G09G 3/20* (2006.01)
*G09G 3/3225* (2016.01)
*G09G 3/30* (2006.01)

(52) U.S. Cl.
CPC ............ *G09G 3/2022* (2013.01); *G09G 3/30* (2013.01); *G09G 3/3225* (2013.01);
(Continued)

(58) Field of Classification Search
CPC ............... G09G 3/2022; G09G 3/3225; G09G 2300/0842; G09G 2310/08
See application file for complete search history.

(56) References Cited

U.S. PATENT DOCUMENTS

2004/0027362 A1 2/2004 Sato
2005/0017778 A1* 1/2005 Nogawa ............... G09G 3/2014 327/165
(Continued)

FOREIGN PATENT DOCUMENTS

CN 1465040 A 12/2003
CN 1674072 A 9/2005
(Continued)

*Primary Examiner* — Charles Hicks
(74) *Attorney, Agent, or Firm* — Muncy, Geissler, Olds & Lowe, P.C.

(57) ABSTRACT

An method of driving an AMOLED is provided, including: dividing grayscale values of each pixel of each frame into N portions, so as to obtain N PWM driving signals of an organic light emitting diode; dividing the driving time of each frame of the organic light emitting diode into N sub-driving times, wherein one of the sub-driving times of each frame corresponds to one of the PWM driving signals; and transmitting all of the PWM driving signals of each frame to the organic light emitting diode at the corresponding sub-driving time, so as to drive and display an image.

14 Claims, 3 Drawing Sheets

(52) U.S. Cl.
CPC . *G09G 2300/0842* (2013.01); *G09G 2310/08* (2013.01); *G09G 2320/064* (2013.01); *H05K 999/99* (2013.01)

(56) References Cited

U.S. PATENT DOCUMENTS

| | | | | |
|---|---|---|---|---|
| 2005/0140699 | A1 | 1/2005 | Ito | |
| 2005/0212729 | A1 | 9/2005 | Chung et al. | |
| 2007/0035488 | A1 | 2/2007 | Kimura | |
| 2007/0057874 | A1 * | 3/2007 | Le Roy | G09G 3/3233 345/76 |
| 2013/0009938 | A1 * | 1/2013 | Hwang | G09G 3/348 345/212 |
| 2013/0141469 | A1 | 6/2013 | Xi | |

FOREIGN PATENT DOCUMENTS

| | | | |
|---|---|---|---|
| CN | 1783194 | A | 6/2006 |
| CN | 103959365 | A | 7/2014 |

* cited by examiner

METHOD FOR DRIVING AMOLED

FIELD OF THE INVENTION

The present invention relates to the field of electronic displays, and more particularly to a method of driving an active-matrix organic light emitting diode (AMOLED).

BACKGROUND OF THE INVENTION

With the improvement of process technology and material in flat panel display, an AMOLED has gradually become a mainstream choice for future display devices.

FIG. 1 shows a conventional AMOLED driving circuit, which comprises a first semiconductor controllable switch T1, a second semiconductor controllable switch T2, an energy storage capacitor C1, and an organic light emitting diode D1. A terminal of the second semiconductor controllable switch T2 is connected to a first controlling voltage VDD, and the other terminal is connected with a positive electrode of the organic light emitting diode D1. A negative electrode of the organic light emitting diode D1 is connected to a second controlling voltage VSS. A source of the first semiconductor controllable switch T1 is connected to a data driving signal SN of the AMOLED display panel, a gate of the first semiconductor controllable switch T1 is connected to a scan driving signal GN of the AMOLED display panel, and a drain of the first semiconductor controllable switch T1 is connected to a gate of the second semiconductor controllable switch T2. The storage capacitor C1 is connected between the gate and source of the second semiconductor controllable switch T2, so that the second semiconductor controllable switch T2 works in a saturation region, thereby providing current to the AMOLED for emitting light.

In order to increase drive consistency of the AMOLED driving circuit, panel manufacturers provide a method using pulse width modulation to drive the AMOLED driving circuit (please refer to CN Patent Application No. 201410014397.X, titled "AMOLED driving circuit and driving method thereof"). By dividing a driving time in one frame of an organic light emitting diode into N sub-frame times, the influence of the storage capacitor C1 applied to the second semiconductor controllable switch T2 can be eliminated, but a transmission speed of a data driving signal at each sub-frame time should be relatively increased, so that the data transmission speed of the AMOLED driving circuit will be restricted by a transmission speed of a driver IC and an access speed of a storage.

Accordingly, it is necessary to provide a method of driving an AMOLED to solve the technical problem in the prior art.

SUMMARY OF THE INVENTION

An object of the present invention is to provide a method of driving an AMOLED for which there is a low demand for a transmission speed of a driver IC and an access speed of a storage, so as to solve the problems that the prior art method of driving an AMOLED has high demands for a transmission speed of a driver IC and an access speed of a storage.

In order to solve the above-mentioned problems, the technical solution of the present invention is as follows.

The present invention provides a method of driving an AMOLED, comprising:

representing grayscale values of each pixel of each frame in format of binary values;

dividing the grayscale values of each pixel of each frame by bytes into N portions, so as to obtain N Pulse Width Modulation (PWM) driving signals of an organic light emitting diode, where N is a positive integer greater than or equal to 1;

dividing a driving time of each frame of the organic light emitting diode into N sub-driving times, wherein one of the sub-driving times of each frame corresponds to one of the PWM driving signals; and transmitting all of the PWM driving signals of each frame to the organic light emitting diode at a corresponding sub-driving time, so as to drive and display an image.

In the method of driving an AMOLED of the present invention, the grayscale values of each pixel of each frame are divided into eight portions by bytes, and each PWM driving signal represents one byte of the grayscale values.

In the method of driving an AMOLED of the present invention, the step of dividing a driving time of each frame of the organic light emitting diode into N sub-driving times comprises:

evenly dividing the driving time of each frame of the organic light emitting diode into N sub-driving times; and the step of transmitting all of the PWM driving signals of each frame to the organic light emitting diode at a corresponding sub-driving time, so as to drive and display an image, comprises:

transmitting all of the PWM driving signals of each frame to the organic light emitting diode at the corresponding sub-driving time; and synthesizing all of the PWM driving signals of each frame to form the grayscale values of each pixel of each frame, so as to drive and display the image.

In the method of driving an AMOLED of the present invention, the method of driving an AMOLED further comprises: discharging an energy storage capacitor corresponding the organic light emitting diode by a discharge signal after displaying each frame.

In the method of driving an AMOLED of the present invention, the PWM driving signal comprises a first start signal, a first clock signal, and a first enable signal.

In the method of driving an AMOLED of the present invention, the discharge signal comprises a second start signal, a second clock signal, and a second enable signal.

In the method of driving an AMOLED of the present invention, a range of the grayscale values of each pixel is between 0 and 255.

In the method of driving an AMOLED of the present invention, the PWM driving signal has two statuses including a high level driving signal and a low level driving signal.

The present invention also provides an method of driving an AMOLED, comprising:

dividing grayscale values of each pixel of each frame into N portions, so as to obtain N PWM (Pulse Width Modulation) driving signals of an organic light emitting diode, where N is a positive integer greater than or equal to 1;

dividing a driving time of each frame of the organic light emitting diode into N sub-driving times, wherein one of the sub-driving times of each frame corresponds to one of the PWM driving signals; and transmitting all of the PWM driving signals of each frame to the organic light emitting diode at a corresponding sub-driving time, so as to drive and display an image.

In the method of driving an AMOLED of the present invention, the grayscale values of each pixel of each frame are divided into N portions by bytes.

In the method of driving an AMOLED of the present invention, before the step of dividing grayscale values of each pixel of each frame into N portions, comprises:

representing grayscale values of each pixel of each frame in format of binary values.

In the method of driving an AMOLED of the present invention, the grayscale values of each pixel of each frame are divided into eight portions by bytes, and each PWM driving signal represents one byte of the grayscale values.

In the method of driving an AMOLED of the present invention, the step of dividing a driving time of each frame of the organic light emitting diode into N sub-driving times comprises:

evenly dividing the driving time of each frame of the organic light emitting diode into N sub-driving times; and the step of transmitting all of the PWM driving signals of each frame to the organic light emitting diode at a corresponding sub-driving time, so as to drive and display an image, comprises:

transmitting all of the PWM driving signals of each frame to the organic light emitting diode at the corresponding sub-driving time; and synthesizing all of the PWM driving signals of each frame to form the grayscale values of each pixel of each frame, so as to drive and display the image.

In the method of driving an AMOLED of the present invention, the method of driving an AMOLED further comprises: discharging an energy storage capacitor corresponding to the organic light emitting diode by a discharge signal after displaying each frame.

In the method of driving an AMOLED of the present invention, the PWM driving signal comprises a first start signal, a first clock signal, and a first enable signal.

In the method of driving an AMOLED of the present invention, the discharge signal comprises a second start signal, a second clock signal, and a second enable signal.

In the method of driving an AMOLED of the present invention, a range of the grayscale values of each pixel is between 0 and 255.

In the method of driving an AMOLED of the present invention, the PWM driving signal has two statuses including a high level driving signal and a low level driving signal.

In contrast to the prior art, by using an method of driving an AMOLED of the present invention, grayscale values of each pixel are divided, thereby decreasing the data size of each PWM driving signal, and demands for a transmission speed of a driver IC and an access speed of a storage are thus decreased, so as to solve the problems that the prior art method of driving an AMOLED has high demands for a transmission speed of a driver IC and an access speed of a storage.

In order to make the present invention more clear, preferred embodiments and the drawings thereof are described in detail below.

DETAILED DESCRIPTION OF THE INVENTION

Figure 1:
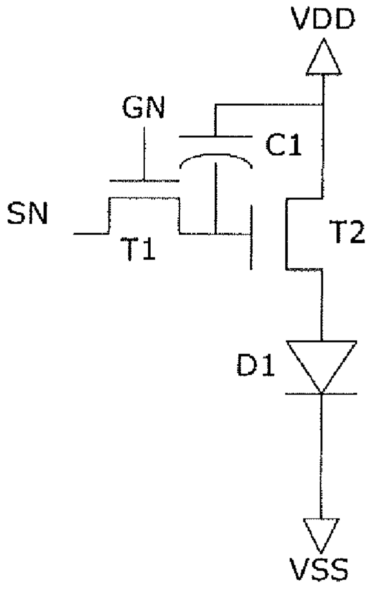
FIG. 1 is an AMOLED driving circuit in the prior art.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, the same reference symbol represents the same or similar components.

Figure 2:
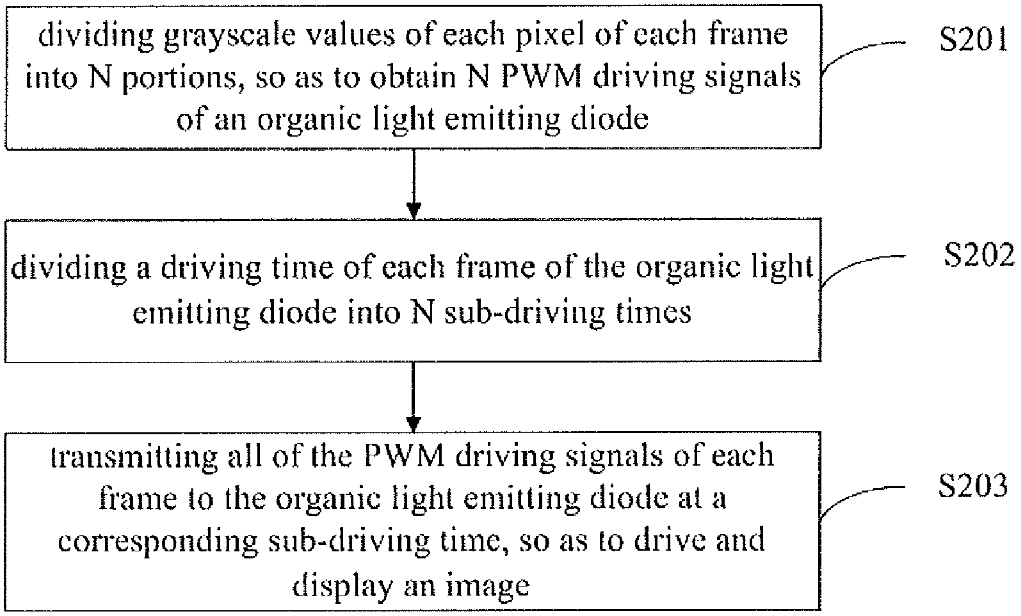
FIG. 2 is a flow chart showing a method of driving an AMOLED according to a first preferred embodiment of the present invention.

Please refer to FIG. 2, which is a flow chart showing a method of driving an AMOLED of a first preferred embodiment of the present invention. The method of driving an AMOLED of the present invention comprises:

At step S201, grayscale values of each pixel of each frame are divided into N portions, so as to obtain N PWM driving signals of an organic light emitting diode;

At step S202, a driving time of each frame of the organic light emitting diode are divided into N sub-driving times; and At step S203, all of the PWM driving signals of each frame are transmitted to the organic light emitting diode at a corresponding sub-driving time, so as to drive and display an image.

Each step of the method of driving an AMOLED of the present preferred embodiment are described below in detail.

In the step S201, the grayscale values of each pixel of each frame are divided into N portions by an AMOLED driving circuit, so that the N PWM driving signals of the light emitting diode are obtained. Each PWM driving signal represents a portion of the grayscale values of a corresponding pixel. N is a positive integer greater than or equal to 1. Then, the step S202 is processed.

In the step S202, the driving time of each frame of the organic light emitting diode is divided into N sub-driving times by the AMOLED driving circuit. A time interval of each sub-driving time is the same, wherein one of the sub-driving times of each frame corresponds to one of the PWM driving signals. Then, the step S203 is processed.

In the step S203, all of the PWM driving signals of each frame acquired from the step S201 are transmitted to the organic light emitting diode at the corresponding sub-driving time acquired from the step S202, so that all of the PWM driving signals of each frame are accumulated by the organic light emitting diode, thereby driving and displaying the image.

Therefore, the image driving process by the method of driving an AMOLED of the present preferred embodiment is accomplished.

In the method of driving an AMOLED of the present preferred embodiment, grayscale values of each pixel are divided, thereby decreasing data size of each PWM driving signal. The data size of all of the PWM driving signals of each frame is 1/N of conventional data size of all of the PWM driving signals of each frame, thereby decreasing demands for a transmission speed of a driver IC and an access speed of a storage.

Figure 3:
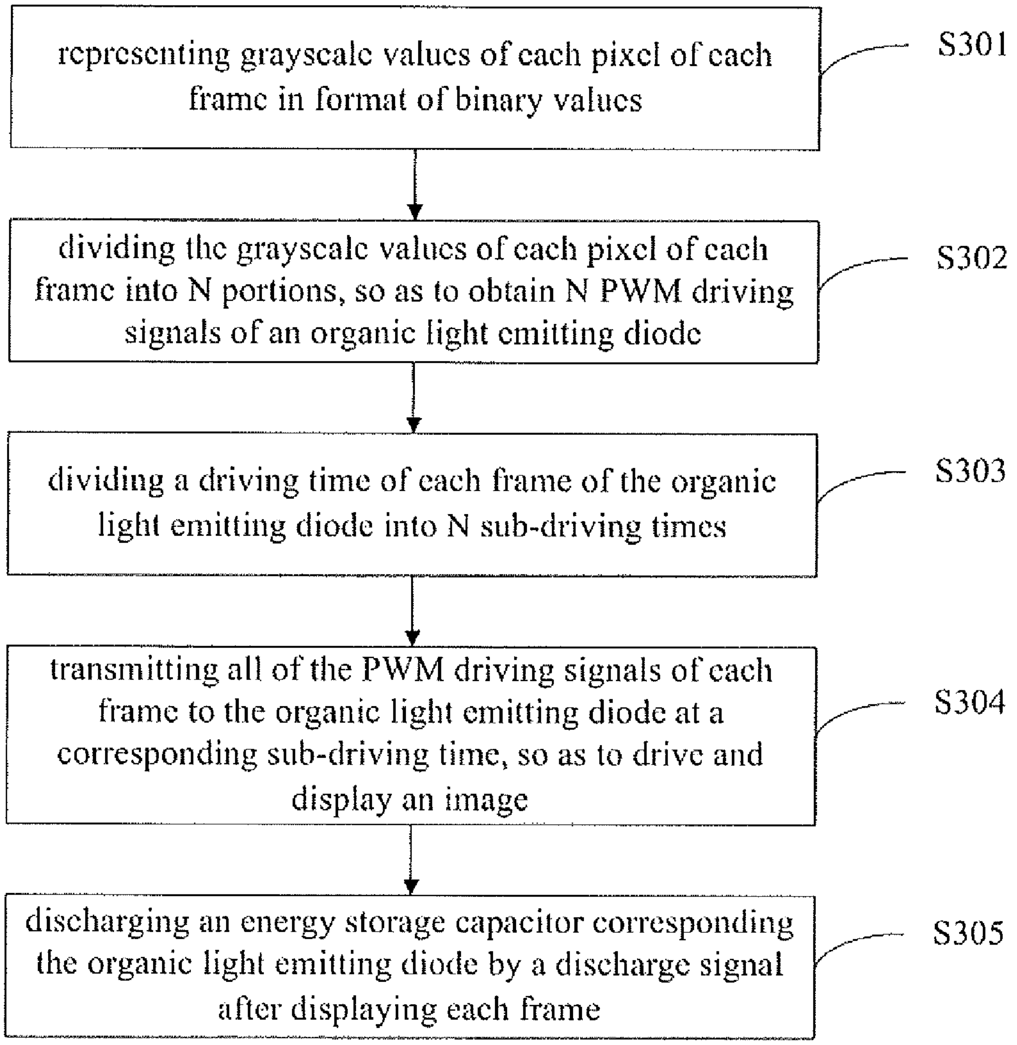
FIG. 3 is a flow chart showing a method of driving an AMOLED according to a second preferred embodiment of the present invention.

Please refer to FIG. 3, which is a flow chart showing a method of driving an AMOLED of a second preferred embodiment of the present invention. The method of driving an AMOLED of the preferred embodiment comprises:

At step S301, grayscale values of each pixel of each frame are represented in format of binary values;

At step S302, the grayscale values of each pixel of each frame are divided into N portions by bytes, so as to obtain N PWM driving signals of an organic light emitting diode;

At step S303, a driving time of each frame of the organic light emitting diode is divided into N sub-driving times; and At step S304, all of the PWM driving signals of each frame are transmitted to the organic light emitting diode at a corresponding sub-driving time, so as to drive and display an image.

At step S305, an energy storage capacitor corresponding the organic light emitting diode is discharged by a discharge signal after displaying each frame.

Each steps of the method of driving an AMOLED of the present preferred embodiment are described below in detail.

In the step S301, an AMOLED driving device uses binary values to represent the grayscale values of each pixel of each frame. Since a range of the grayscale values of two pixels is between 0 and 255, the range of the grayscale values is between 0 and 11111111. Then, the step S302 is processed.

In the step S302, the grayscale values of each pixel of each frame are divided into N portions by the AMOLED driving device, so as to obtain the N PWM driving signals of the light emitting diode. To be specific, the grayscale values of each pixel of each frame are divided into eight portions by bytes, and each PWM driving signal represents one byte of the grayscale values. Then, the step S303 is processed.

In the step S303, the driving time of each frame of the organic light emitting diode is evenly divided into N sub-driving times by the AMOLED driving device, so as to effectively display by the organic light emitting diode using each PWM driving signal. Then, the step S304 is processed.

In the step S304, all of the PWM driving signals of each frame are transmitted to the organic light emitting diode at the corresponding sub-driving time by the AMOLED driving device, so as to drive and display an image.

Specifically, all of the PWM driving signals of each frame are firstly transmitted to the organic light emitting diode at the corresponding sub-driving time by the AMOLED driving device. That is, each PWM driving signal comprises a first start signal, which is used for controlling the start of the PWM driving signal, a first clock signal, which is used for controlling the time of the PWM driving signal, and a first enable signal, which is used for controlling the output of the PWM driving signal. Since one byte of the grayscale values can only be 1 or 0, the PWM driving signal only comprises two statuses which are a high level driving signal and a low level driving signal, which are used to respectively represent 0 or 1.

After all of the PWM driving signals of each frame are synthesized by the AMOLED driving device, the grayscale values of each pixel of each frame are formed, so as to drive and display the image. Then, the step S305 is processed.

In the step S305, after displaying each frame by the AMOLED driving device, the energy storage capacitor corresponding to the organic light emitting diode is discharged by the discharge signal, so that the influence of the storage capacitor applied to the image display can be effectively eliminated. The discharge signal comprises a second start signal, which is used for controlling the start of the discharge signal, a second clock signal, which is used for controlling the time of the discharge signal, and a second enable signal, which is used for controlling the output of the discharge signal.

Therefore, the image driving process by the method of driving an AMOLED of the present preferred embodiment is accomplished.

The present preferred embodiment is based on the first preferred embodiment, by subdividing the PWM driving signal, the data size of the PWM driving signal is small. Moreover, by setting the discharge signal, the influence of the storage capacitor applied to the image display can be eliminated, thus the display effect of the corresponding display device is improved.

In the method of driving an AMOLED of the present invention, by dividing the grayscale values of each pixel, the data size of each PWM driving signal is decreased, thereby decreasing the demands for a transmission speed of a driver IC and an access speed of a storage, so as to solve the problems that the prior art method of driving an AMOLED has high demands for a transmission speed of a driver IC and an access speed of a storage.

In summary, the above descriptions are merely preferred embodiments of the present invention, and are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A method of driving an active-matrix organic light emitting diode (AMOLED), comprising:

representing grayscale values of each pixel of each frame in format of binary values;

dividing the grayscale values of each pixel of each frame by bytes into N portions, so as to obtain N PWM (Pulse Width Modulation) driving signals of an organic light emitting diode, where N is a positive integer greater than or equal to 1;

dividing a driving time of each frame of the organic light emitting diode into N sub-driving times, wherein one of the sub-driving times of each frame corresponds to one of the PWM driving signals;

transmitting all of the PWM driving signals of each frame to the organic light emitting diode at a corresponding sub-driving time; and synthesizing all of the PWM driving signals of each frame to form the grayscale values of each pixel of each frame, so as to drive and display an image;

wherein the grayscale values of each pixel of each frame are divided into 8 bits, and each PWM driving signal represents one bit of the grayscale values.

2. The method of driving an AMOLED as claimed in claim 1, further comprising: discharging an energy storage capacitor corresponding the organic light emitting diode by a discharge signal after displaying each frame.

3. The method of driving an AMOLED as claimed in claim 1, wherein the PWM driving signal comprises a first start signal, a first clock signal, and a first enable signal.

4. The method of driving an AMOLED as claimed in claim 2, wherein the discharge signal comprises a second start signal, a second clock signal, and a second enable signal.

5. The method of driving an AMOLED as claimed in claim 1, wherein a range of the grayscale values of each pixel is between 0 and 255.

6. The method of driving an AMOLED as claimed in claim 1, wherein the PWM driving signal has two statuses including a high level driving signal and a low level driving signal.

7. A method of driving an active-matrix organic light emitting diode (AMOLED), comprising:

dividing grayscale values of each pixel of each frame into N portions, so as to obtain N PWM (Pulse Width Modulation) driving signals of an organic light emitting diode, where N is a positive integer greater than or equal to 1;

dividing a driving time of each frame of the organic light emitting diode into N sub-driving times, wherein one of the sub-driving times of each frame corresponds to one of the PWM driving signals;

transmitting all of the PWM driving signals of each frame to the organic light emitting diode at a corresponding sub-driving time; and synthesizing all of the PWM driving signals of each frame to form the grayscale values of each pixel of each frame, so as to drive and display an image;

wherein the grayscale values of each pixel of each frame are divided into 8 bits, and each PWM driving signal represents one bit of the grayscale values.

8. The method of driving an AMOLED as claimed in claim 7, wherein the grayscale values of each pixel of each frame are divided into N portions by bytes.

9. The method of driving an AMOLED as claimed in claim 7, wherein before the step of dividing grayscale values of each pixel of each frame into N portions, the method further comprises:

representing grayscale values of each pixel of each frame in format of binary values.

10. The method of driving an AMOLED as claimed in claim 7, further comprising: discharging an energy storage capacitor corresponding to the organic light emitting diode by a discharge signal after displaying each frame.

11. The method of driving an AMOLED as claimed in claim 7, wherein the PWM driving signal comprises a first start signal, a first clock signal, and a first enable signal.

12. The method of driving an AMOLED as claimed in claim 10, wherein the discharge signal comprises a second start signal, a second clock signal, and a second enable signal.

13. The method of driving an AMOLED as claimed in claim 7, wherein a range of the grayscale values of each pixel is between 0 and 255.

14. The method of driving an AMOLED as claimed in claim 7, wherein the PWM driving signal has two statuses including a high level driving signal and a low level driving signal.

* * * * *